(12) United States Patent
Kubota

(10) Patent No.: US 6,355,185 B1
(45) Date of Patent: Mar. 12, 2002

(54) PIEZOELECTRIC PASTE AND PIEZOELECTRIC FILM AND PIEZOELECTRIC PART USING THE SAME

(75) Inventor: Teppei Kubota, Kusatsu (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 09/552,382

(22) Filed: Apr. 19, 2000

(30) Foreign Application Priority Data

Apr. 22, 1999 (JP) ............................................ 11-114536
Nov. 9, 1999 (JP) ............................................ 11-317734

(51) Int. Cl.$^7$ ......................... H01L 41/18; H01L 41/16; H01L 41/187; H01L 41/22; H01L 41/24
(52) U.S. Cl. ..................... 252/62.9 R; 252/62.9 PZ; 501/17; 501/32; 501/134; 427/100
(58) Field of Search ................... 252/62.9 R, 62.9 PZ; 501/32, 17, 134; 427/100

(56) References Cited

U.S. PATENT DOCUMENTS 5,403,788 A  *  4/1995  Nishida et al. ........ 252/62.9 R

FOREIGN PATENT DOCUMENTS

| EP | 0376670 | 12/1989 |
|---|---|---|
| GB | 1466704 | 3/1977 |
| GB | 2161647 A | 1/1986 |
| WO | 98/43925 | 10/1998 |

* cited by examiner

*Primary Examiner*—C. Melissa Koslow

(57) ABSTRACT

A piezoelectric paste which is used for forming a piezoelectric thick film by the thick film forming technique, which can be burned at a relative low temperature and which can form a piezoelectric film having good polarizability and high piezoelectricity while maintaining the ferroelectricity possessed by a piezoelectric crystal powder contained in the piezoelectric paste contains the piezoelectric crystal powder containing a Pb(Zr, Ti)O$_3$ system ceramic, a crystallized glass powder and an organic vehicle, wherein the crystallized glass powder used precipitates a Pb(Zr, Ti)O$_3$ system solid solution phase by heat treatment.

20 Claims, 2 Drawing Sheets

PIEZOELECTRIC PASTE AND PIEZOELECTRIC FILM AND PIEZOELECTRIC PART USING THE SAME

BACKGROUND OF THE INVENTION

1. Field of the Invention

The present invention relates to a piezoelectric paste, and particularly to a piezoelectric paste advantageously used for forming a piezoelectric film provided as a thick film in a piezoelectric part such as a piezoelectric actuator, a oscillator, a piezoelectric sensor, or the like.

The present invention also relates to a piezoelectric film formed by using the above piezoelectric paste, and a piezoelectric part comprising the piezoelectric film.

2. Description of the Related Art

Typical examples of known perovskite oxides exhibiting ferroelectricity and high piezoelectricity include $Pb(Zr, Ti)O_3$ system ceramics, i.e., PZT ceramic crystals. PZT ceramic crystals can be obtained by, for example, mixing $Pb_3O_4$, $TiO_2$ and $ZrO_3$ raw material powders using a ball mill and then effecting a solid solution reaction by calcination.

In using such PZT crystals for forming the piezoelectric portion of a piezoelectric part such as a piezoelectric actuator, oscillator, piezoelectric sensor, or the like, the piezoelectric film is formed in the shape of a thick film in some cases. In order to form such a piezoelectric film, the PZT crystals are prepared in a powder state, and a glass powder and an organic vehicle are added to the PZT crystal powder to form a piezoelectric paste, which is coated and burned to form a thick film.

Since the sintering temperature of the PZT crystal grains exceeds 1000° C., evaporation of lead is not negligible in the burning step, and thus the sintering temperature is desired to be decreased as much as possible. Therefore, a powder containing as a main component amorphous stable glass having a low softening point and causing viscous flow in the burning step, for example, such as borosilicate glass, alkali-added glass, or the like, is used as the glass powder to be added to the piezoelectric paste, for causing the glass powder to also function as a sintering additive.

However, a piezoelectric film after burning the piezoelectric paste containing the above-described amorphous glass having a low softening point has a state in which the PZT crystal grains are covered with an amorphous glass phase having a low dielectric constant, deteriorating the ferroelectricity of the piezoelectric film. This causes difficulties in rotation of dipoles, and thus causes the problem of deteriorating the performance of a polarization treatment by application of a DC electric field.

In the piezoelectric film formed by the above-mentioned thick film forming technique, a piezoelectric constant $d_{ij}$ which is an important piezoelectric property, is decreased due to a decrease in polarizability, decreasing the piezoelectric strain value in application of an external electric field. Therefore, the construction of a piezoelectric actuator using such as piezoelectric film has the problem of decreasing flexure caused by element bending during drive.

SUMMARY OF THE INVENTION

Accordingly, it is an object of the present invention to provide piezoelectric paste maintaining the ferroelectricity of piezoelectric crystals such as PZT ceramic crystals, and thus causing no decrease in polarizability and permitting the achievement of high piezoelectricity and the formation of a piezoelectric film, and to provide a piezoelectric film formed by using the piezoelectric paste and a piezoelectric part comprising the piezoelectric film.

In order to solve the above-described technical problems, the present invention is characterized in brief by using, as the glass powder contained in piezoelectric paste, a powder comprising crystallized glass which precipitates a solid solution phase such as a PZT solid solution phase having ferroelectricity and high piezoelectricity by heat treatment such as burning.

In more detail, the piezoelectric paste of the present invention comprises a piezoelectric crystal powder, a crystallized glass powder precipitating a solid solution phase by heat treatment and an organic vehicle.

In a preferred embodiment, the piezoelectric paste of the present invention comprises a piezoelectric crystal powder containing a $Pb(Zr, Ti)O_3$ system ceramic, a crystallized glass powder precipitating a $Pb(Zr, Ti)O_3$ system solid solution phase by heat treatment and an organic vehicle.

The piezoelectric crystal powder preferably has a composition represented by the formula $Pb(Zr_xTi_{1-x})O_3$ wherein x is in the range of about 0.49 to 0.56.

The piezoelectric crystal powder more preferably comprises a compound perovskite oxide containing a first component having a composition represented by the formula $Pb(Zr_xTi_{1-x})O_3$ wherein x is in the range of about 0.49 to 0.56, and a second component having a composition represented by the formula $Pb(Zn_{1/3}Nb_{2/3})O_3$, $Pb(Mg_{1/3}Nb_{2/3})O_3$ or $Pb(Ni_{1/3}Nb_{2/3})O_3$, wherein the content of the second component is in the range of about 10% to 40% by weight based on the total of the first and second components.

The compound perovskite oxide is obtained by calcining a mixture of a crystal powder of the first component and a crystal powder of the second component.

The second component preferably further contains $BaTiO_3$. The second component containing $BaTiO_3$ is preferably obtained by adding a $BaTiO_3$ crystal powder having an average grain diameter of about 0.5 $\mu$m or less to a raw material of $Pb(Zn_{1/3}Nb_{2/3})O_3$, $Pb(Mg_{1/3}Nb_{2/3})O_3$ or $Pb(Ni_{1/3}Nb_{2/3})O_3$, followed by heat treatment.

In an embodiment, the crystallized glass powder preferably contains a main component represented by the formula $iPbO$—$jTiO_2$—$kZrO_2$—$mSiO_2$ wherein i is in the range of about 62 to 70 mol %, j is in the range of about 7 to 19 mol %, k is in the range of about 7 to 19 mol %, and m is in the range of about 8 to 9 mol %, and an additive component composed of $Bi_2O_3$ or $MnO_2$ and having a content of about 3 parts by weight based on 100 parts by weight of main component.

The present invention also provides a piezoelectric film obtained by coating the above-described piezoelectric paste on a substrate, and burning it.

In the piezoelectric film of the present invention, the burning temperature is preferably selected in the range of about 800 to 950° C.

The present invention further provides a piezoelectric part comprising an insulating substrate, a lower first layer electrode formed on the insulating substrate, a piezoelectric film formed on the lower layer electrode, and an upper second layer electrode formed on the piezoelectric film. In this piezoelectric part, the piezoelectric film comprises the above-described piezoelectric film.

DESCRIPTION OF THE PREFERRED EMBODIMENT

As described above, piezoelectric paste of the present invention comprises a piezoelectric crystal powder, for example, such as a piezoelectric crystal powder containing a Pb(Zr, Ti)O$_3$ ceramic, a crystallized glass powder precipitating a solid solution phase such as a Pb(Zr, Ti)O$_3$ system solid solution phase by heat treatment, and an organic vehicle. As the organic vehicle, for example, a mixture of a binder such as ethyl cellulose or an alkyd resin and an organic solvent can be used.

First Embodiment
Composition of Piezoelectric Crystal Powder

In the first embodiment, the piezoelectric crystal powder has a composition represented by the formula Pb(Zr$_x$Ti$_{1-x}$)O$_3$ wherein x is in the range of about 0.49 to 0.56.

Figure 1:
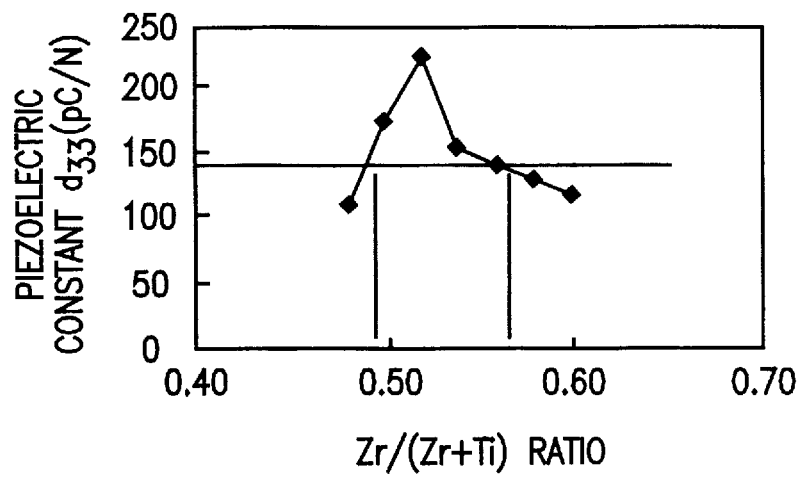
FIG. 1 is a graph showing the relation between piezoelectric constant $d_{33}$ and the $Zr/(Zr+Ti)$ ratio, and showing a preferred range of Zr/(Zr+Ti) ratios for a PZT piezoelectric crystal powder contained in piezoelectric paste in accordance with a specified embodiment of the present invention.

In order to determine x, i.e., the Zr/(Zr+Ti) ratio, in the preferred composition, the Zr/(Zr+Ti) ratio was changed to form PZT crystal powders having different compositions, as shown in FIG. 1. Each of the crystal powders was burned to form a sintered compact, and the piezoelectric constant $d_{33}$ of the sintered compact of each sample was measured. FIG. 1 shows the piezoelectric constants $d_{33}$ obtained by changing the Zr/(Zr+Ti) ratio.

FIG. 1 indicates that where the piezoelectric constant $d_{33}$ lower limit necessary for designing the piezoelectric crystal powder contained in the piezoelectric paste is $d_{33} \geq 140$ pC/N, the Zr/(Zr+Ti) ratio, i.e., the x range, satisfying this condition is about 0.49 to 0.56.

Composition of Crystallized Glass Powder

In this embodiment, as described above, the crystallized glass powder contained in the piezoelectric paste contains a main component represented by the formula iPbO—jTiO$_2$—kZrO$_2$—mSiO$_2$ wherein i is in the range of about 62 to 70 mol %, j is in the range of about 7 to 19 mol %, k is in the range of about 7 to 19 mol %, and m is in the range of about 8 to 9 mol %, and an additive component composed of Bi$_2$O$_3$ or MnO$_2$ and having a content of about 3 parts by weight based on 100 parts by weight of main component. In order to determine the preferred composition of such a crystallized glass powder, the following experiment was carried out.

Pb$_3$O$_4$, TiO$_2$, ZrO$_2$, SiO$_2$ and Bi$_2$O$_3$ were prepared as starting components of the glass component and mixed at various ratios. Each of the resulting mixtures was melted at a temperature of 1400° C., rapidly cooled by water cooling, and then crushed by a pot to obtain crystallized glass powders having different compositions.

In producing the crystallized glass powder, where both the TiO$_2$ and ZrO$_2$ amounts are in the range of about 7 to 19 mol %, and the Pb$_3$O$_4$ amount is less than about 62 mol % in terms of PbO, or the SiO$_2$ amount exceeds 9 mol %, the ratio of the ferroelectric crystal phase produced is decreased to decrease dielectric properties. On the other hand, where both the TiO$_2$ and ZrO$_2$ amounts are in the same range, and the Pb$_3$O$_4$ amount exceeds about 70 mol % in terms of PbO, or the SiO$_2$ amount is less than about 8 mol %, the Pb amount is excessive to readily cause a composition deviation due to evaporation.

In consideration on the basis of the amounts of nucleating agents such as TiO$_2$ and ZrO$_2$, where both the TiO$_2$ and ZrO$_2$ amounts are less than about 7 mol %, crystallization is delayed, and the ratio of the ferroelectric crystal phase produced is decreased, thereby decreasing dielectric properties. On the other hand, where the amounts of the nucleating agents TiO$_2$ and ZrO$_2$ are increased to over about 19 mol %, crystals remain in a melt state to cause difficulties in producing the glass.

Therefore, the main component of the crystallized glass powder preferably contains about 62 to 70 mol % of about PbO, about 7 to 19 mol % of about TiO$_2$, 7 to 19 mol % of ZrO$_2$, and about 8 to 9 mol % of SiO$_2$.

The crystallized glass powder formed by adding an additive component comprising, for example, Bi$_2$O$_3$ to the main component having the above-described preferred composition was heated in the temperature range of 550 to 700° C. to produce crystallization and solid solution due to precipitation of the ferroelectric phase and produce a PZT solid solution phase at 700° C. The reaction product of PbO—SiO$_2$ was also produced as a by-product phase. Furthermore, sintering was accelerated to form a dense grain structure in the temperature region of 800° C. or more. In this step, the by-product phase disappeared, and the addition of Bi$_2$O$_3$ in the step of preparing glass raw materials accelerated crystal grain growth.

By replacing Bi$_2$O$_3$ as the additive component by MnO$_2$, the crystallization temperature was decreased to 500° C. to produce the PZT solid solution phase at about 600° C., and a further fine crystal grain structure is formed.

The content of the additive component composed of Bi$_2$O$_3$ or MnO$_2$ was set to about 3 parts by weight on the basis of 100 parts by weight of the main component, thereby inhibiting the production of the by-product phase which is unnecessary for the desired properties. This amount, however, can be varied appropriately depending on the particular glass being prepared.

Example of Piezoelectric Part

Figure 2:
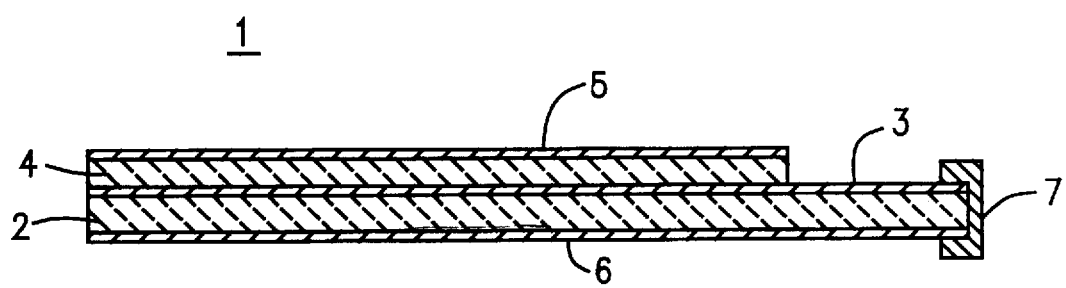
FIG. 2 is a sectional view schematically showing a piezoelectric part in accordance with an embodiment of the present invention.

FIG. 2 shows, in section, the structure of a piezoelectric part in accordance with an embodiment of the present invention.

The piezoelectric part 1 shown in FIG. 2 constitutes, for example, a piezoelectric actuator and comprises an insulating substrate 2, a lower layer electrode 3 formed on the main surface of the insulating substrate 2, which faces upward in the drawing, a piezoelectric film 4 formed on the lower layer electrode 3, and an upper layer electrode 5 formed on the piezoelectric film 4. Furthermore, a back electrode 6 is formed on the other main surface of the insulating substrate 2, which faces downward in the drawing, such that the back electrode 6 and the lower layer electrode 3 are connected to each other by an end surface electrode 7 formed on an end surface of the insulating substrate 2.

In this piezoelectric part 1, the piezoelectric film 4 is obtained by coating the above-described piezoelectric paste and then burning it.

In order to evaluate the piezoelectric properties of the piezoelectric film 4, particularly, the piezoelectric constant, of the piezoelectric part 1 shown in FIG. 2, the following experiment was carried out.

Preparation of Piezoelectric Paste

As a crystallized glass powder contained in the piezoelectric paste for forming the piezoelectric film 4, four type powders a-1, a-2, b-1 and b-2 respectively having the compositions shown in Table 1 below were prepared. In Table 1, the composition of each of PbO, $TiO_2$, $ZrO_2$ and $SiO_2$ in the main component is shown by mol %, and the composition of each of $Bi_2O_3$ and $MnO_2$ as the additive component is shown by parts by weight based on 100 parts by weight of main component.

TABLE 1

| Glass Type | 100 parts by weight | | | | $Bi_2O_3$ | $MnO_2$ |
|---|---|---|---|---|---|---|
| | PbO | $TiO_2$ | $ZrO_2$ | $SiO_2$ | parts by weight | parts by weight |
| a-1 | 62.9 | 14.9 | 13.8 | 8.4 | 3 | 0 |
| a-2 | 62.9 | 14.9 | 13.8 | 8.4 | 0 | 3 |
| b-1 | 69.9 | 11.1 | 10.2 | 8.8 | 3 | 0 |
| b-2 | 69.9 | 11.1 | 10.2 | 8.8 | 0 | 3 |

As the piezoelectric crystal powder to be contained in the piezoelectric paste, a powder having a Zr/Ti ratio of 0.52/0.48, i.e., a composition represented by $Pb(Zr_{0.52}Ti_{0.48})O_3$, was prepared.

These crystallized glass powders and the piezoelectric crystal powder were combined. Namely, 64% by weight of piezoelectric crystal powder, 16% by weight of crystallized glass powder, 20% by weight of ethyl cellulose-based binder, and an organic solvent as a medium were mixed, and the resultant mixture was dispersed by using a roll mill to obtain samples 1 to 4 of piezoelectric paste shown in Table 2.

Preparation of Piezoelectric Part

By using each of the thus-obtained piezoelectric paste samples, the thin insulating substrate 2 composed of partially stabilized $ZrO_2$ having high toughness and the lower layer electrode 3 and comprising the back surface electrode 6 each comprising a Pt thin film of about 1.0 µm thick were prepared for forming the piezoelectric part shown in FIG. 2. In order to form the piezoelectric film 4 on the lower layer electrode 3, the piezoelectric paste was screen-coated, sufficiently dried, and then heat-treated for burning in air. In this heat treatment, a temperature profile was used in which the coating was heated at a low heating rate of 1° C./min in the crystallization temperature region of 500 to 700° C., and then completely sintered by maintaining at 950° C. for 3 hours. The thickness of the piezoelectric film 4 after burning was adjusted to be in the range of about 35 to 55 µm.

Next, the upper layer electrode 5 comprising a silver thin film was formed on the piezoelectric film 4, and the end surface electrode 7 comprising a thermally cured film containing silver was formed.

In order to polarize the thus-obtained piezoelectric part 1 of each of the samples, the piezoelectric part 1 was immersed in silicone oil at 80° C. for 30 minutes with a DC electric field of 50 kV/cm applied to the piezoelectric film 4.

TABLE 2

| Sample No. | PZT Composition | Glass Type | Piezoelectric Constant (pC/N) |
|---|---|---|---|
| 1 | Zr/Ti = 0.52/0.48 | a-1 | 118 |
| 2 | Zr/Ti = 0.52/0.48 | b-1 | 145 |
| 3 | Zr/Ti = 0.52/0.48 | a-2 | 50 |
| 4 | Zr/Ti = 0.52/0.48 | b-2 | 66 |

As a result of the polarization, as shown in table 2, the samples 1 and 2 of the piezoelectric paste for forming the piezoelectric film 4, which contained a $PbO—TiO_2—ZrO_2—SiO_2—Bi_2O_3$ system crystallized glass powder, showed a piezoelectric constant $d_{33}$ of 118 to 145 pC/N, and the samples 3 and 4 containing a $PbO—TiO_2—ZrO_2—SiO_2—MnO_2$ system crystallized glass powder showed a piezoelectric constant $d_{33}$ of 50 to 66 pC/N.

Second Embodiment

Composition of Piezoelectric Crystal Powder

In this embodiment, a piezoelectric crystal powder to be contained in the piezoelectric paste comprises a compound perovskite oxide containing not only a first component having a composition represented by the same formula $Pb(Zr_xTi_{1-x})O_3$ as the first embodiment wherein x is in the range of about 0.49 to 0.56, but also a second component having a composition represented by the formula $Pb(Zn_{1/3}Nb_{2/3})O_3$, $Pb(Mg_{1/3}Nb_{2/3})O_3$ or $Pb(Ni_{1/3}Nb_{2/3})O_3$. p In this embodiment, the second component preferably further contains $BaTiO_3$, and is more preferably obtained by adding $BaTiO_3$ having an average particle diameter of about 0.5 µm or less to a raw material of $Pb(Zn_{1/3}Nb_{2/3})O_3$, $Pb(Mg_{1/3}Nb_{2/3})O_3$ or $Pb(Ni_{1/3}Nb_{2/3})O_3$, followed by heat treatment.

In order to obtain this second component, for example, the following operation is carried out.

With the second component having a composition represented by $Pb(Zn_{1/3}Nb_{2/3})O_3$, $Pb_3O_4$, ZnO and $Nb_2O_5$ and $BaTiO_3$ fine particles (average particle size 0.5 µm) obtained by hydrothermal synthesis were prepared as starting raw materials of the second component. 59.1 mol % of ZnO and 40.9 mol % of $Nb_2O_5$ were weighed and mixed, and the resultant mixture is calcined at 900° C. and then ground. Then, $Pb_3O_4$ and $BaTiO_3$ are mixed with the $ZnO—Nb_2O_5$ calcined powder. In this mixed state, the mixing amounts are adjusted so that $Pb_3O_4$ is 69.8 mol % in terms of PbO, ZnO is 13.7 mol %, $Nb_2O_5$ is 9.5 mol % and $BaTiO_3$ is 7.0 mol %.

In this mixture, $BaTiO_3$ is added for preventing a pyrochlore phase as a paraelectric phase from remaining due to a shortage of seed crystals. The average gain diameter of the $BaTiO_3$ crystal powder is adjusted to about 0.5 µm or less, and the effect of the addition of $BaTiO_3$ is thus readily exhibited. This applies to the case of the $Pb(Mg_{1/3}Nb_{2/3})O_3$ system second component and the $Pb(Ni_{1/3}Nb_{2/3})O_3$ system second component, which will be described below.

Next, the above-described mixture is calcined in a crucible at 900° C. for 12 hours to obtain a crystal powder of the second component as a stable PZN powder having the perovskite structure.

With the second component having a composition represented by $Pb(Mg_{1/3}Nb_{2/3})O_3$, $Pb_3O_4$, $MgCO_3$ and $Nb_2O_5$ and $BaTiO_3$ fine particles (average particle size 0.5 µm) obtained by hydrothermal synthesis were prepared as starting raw materials of the second component. 50 mol % of $MgCO_3$ in terms of MgO, and 50 mol % of $Nb_2O_5$ were weighed and mixed, and the resultant mixture is calcined at 900° C. and then ground. Then, $Pb_3O_4$ and $BaTiO_3$ are mixed with the MgO—Nb$_2$O$_5$ calcined powder. In this mixed state, the mixing amounts are adjusted so that Pb$_3$O$_4$ is 69.8 mol % in terms of PbO, MgO is 11.6 mol %, Nb$_2$O$_5$ is 11.6 mol % and BaTiO$_3$ is 7.0 mol %.

Next, the above-described mixture is calcined in a crucible at 900° C. for 12 hours to obtain a crystal powder of the second component as a stable PMN powder having the perovskite structure.

With the second component having a composition represented by Pb(Ni$_{1/3}$Nb$_{2/3}$)O$_3$, Pb$_3$O$_4$, NiCO$_3$ and Nb$_2$O$_5$ and BaTiO$_3$ fine particles (average particle size 0.5 μm) obtained by hydrothermal synthesis were prepared as starting raw materials of the second component. 50 mol % of NiCO$_3$ in terms of NiO, and 50 mol % of Nb$_2$O$_5$ were weighed and mixed, and the resultant mixture is calcined at 900° C. and then ground. Then, Pb$_3$O$_4$ and BaTiO$_3$ are mixed with the NiO—Nb$_2$O$_5$ calcined powder. In this mixed state, the mixing amounts are adjusted so that Pb$_3$O$_4$ is 69.8 mol % in terms of PbO, NiO is 11.6 mol %, Nb$_2$O$_5$ is 11.6 mol % and BaTiO$_3$ is 7.0 mol %.

Next, the above-described mixture is calcined in a crucible at 900° C. for 12 hours to obtain a crystal powder of the second component as a stable PNN powder having the perovskite structure.

The perovskite compound oxide which constitutes the piezoelectric crystal powder can be obtained by calcining a mixture of the crystal powders of the first and second components; the content of the second component is preferably in the range of about 10% to 40% by weight based on the total amount of the first and second components.

Figure 3:
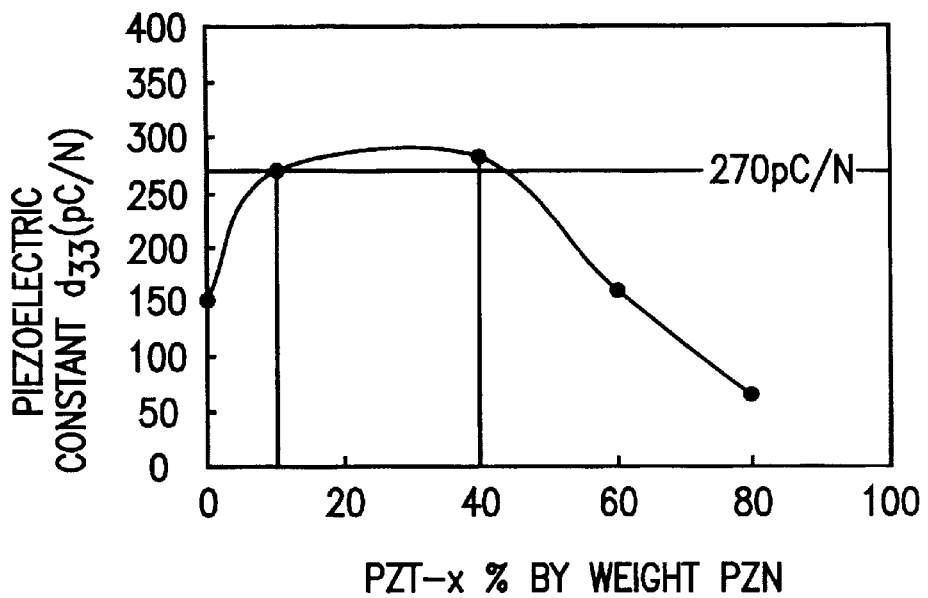
FIG. 3 is a graph showing the relation between piezoelectric constant $d_{33}$ and PZT-x% by weight PZN, and showing a preferred PZN content for a piezoelectric crystal powder comprising PZT-PZN compound perovskite oxide and contained in piezoelectric paste of the present invention.

In order to determine the preferred range of the second component content, the PZN crystal powder as a typical example of the second component was mixed at various ratios with the PZT crystal powder as the first component having the composition Pb(Zr$_{0.52}$Ti$_{0.48}$)O$_3$, and then each of the mixtures was calcined and ground to obtain a powder comprising a perovskite compound oxide. FIG. 3 shows the piezoelectric constants obtained by changing the amount of the PZN crystal powder added to the perovskite compound oxide to various values.

FIG. 3 indicates that under the condition that the lower limit of piezoelectric constant d$_{33}$ of the crystal mixture necessary for design of the piezoelectric paste material is 270 pC/N or more, the content of the PZN crystal powder satisfying this condition is in the range of about 10 to 40% by weight.

It is confirmed that this applies to the PMN crystal power for PNN crystal powder as the second component.

Next, in order to evaluate the properties of a piezoelectric film formed by piezoelectric paste containing a piezoelectric crystal powder composed of the above-described PZT-PZN compound perovskite oxide, the following experiment was carried out.

In this experiment, samples of the piezoelectric part 1 shown in FIG. 2 were produced under the same conditions as the experiment for determining the piezoelectric constants shown in Table 2 in the first embodiment except the method of forming piezoelectric paste used for forming the piezoelectric film 4, and the method of forming the piezoelectric film 4, was as described below.

Preparation of Piezoelectric Paste

As the piezoelectric crystal powder contained in the piezoelectric paste used in the experiment, powders (samples 11 to 16) each comprising a PZT-PZN compound perovskite oxide powders (samples 17 to 19) each comprising only a PZT crystal powder, a powder (sample 20) comprising a PZT-PMN compound perovskite oxide and a powder (sample 21) comprising a PZT-PNN compound perovskite oxide were prepared, as shown in Table 3 below.

TABLE 3

| Sample No. | Piezoelectric Crystal Composition (calcination temperature) | Burning Condition | Dielectric Constant (1 MHZ) | Dielectric Hystresis Remanent Polarization (μC/cm$^2$) | Coercive Field |
|---|---|---|---|---|---|
| 11 | PZT-PZN | 800° C. × 3 hr | 881 | 14.6 | 12.2 |
| 12 | (700° C.) | 900° C. × 3 hr | 871 | 15.3 | 12.3 |
| 13 |  | 950° C. × 3 hr | 800 | 11.3 | 12.2 |
| 14 | PZT-PZN | 800° C. × 3 hr | 793 | 10.7 | 11.7 |
| 15 | (950° C.) | 900° C. × 3 hr | 766 | 10.2 | 11.5 |
| 16 |  | 950° C. × 3 hr | 751 | 9.7 | 13.0 |
| 17 | PZT | 800° C. × 3 hr | 278 | 3.9 | 15.1 |
| 18 |  | 900° C. × 3 hr | 290 | 5.4 | 17.5 |
| 19 |  | 950° C. × 3 hr | 219 | 5.9 | 16.7 |
| 20 | PZT-PMN (950° C.) | 800° C. × 3 hr | 326 | 5.2 | 21.5 |
| 21 | PZT-PNN (950° C.) | 800° C. × 3 hr | 332 | 2.6 | 20.2 |

In all of the samples 11 to 21 shown in Table 3, PZT having the composition Pb(Zr$_{0.52}$Ti$_{0.48}$)O$_3$ was used.

In the samples 11 to 16, PZN obtained by calcining a mixture containing 69.8 mol % of PbO, 13.7 mol % of ZnO, 9.5 mol % of Nb$_2$O$_5$ and 7.0 mol % of BaTiO$_3$ was used.

In the sample 20, PMN obtained by calcining a mixture containing 69.8 mol % of PbO, 11.6 mol % of MgO, 11.6 mol % of Nb$_2$O$_5$ and 7.0 mol % of BaTiO$_3$ was used.

In the sample 21, PNN obtained by calcining a mixture containing 69.8 mol % of PbO, 11.6 mol % of NiO, 11.6 mol % of Nb$_2$O$_5$ and 7.0 mol % of BaTiO$_3$ was used.

In all of the samples 11 to 16, the mixing ratio of the PZT crystal powder and the PZN crystal powder was set so that the content of the PZN crystal powder was 30% by weight of the total amount of the PZT and PZN crystal powders.

In the sample 20, the mixing ratio of the PZT crystal powder and the PMN crystal powder was set so that the content of the PMN crystal powder was 20% by weight of the total amount of the PZT and PMN crystal powders.

In the sample 21, the mixing ratio of the PZT crystal powder and the PNN crystal powder was set so that the content of the PNN crystal powder was 20.5% by weight of the total amount of the PZT and PNN crystal powders.

In order to obtain the PZT-PZN compound perovskite oxide used in the samples 11 to 16, the PZT and PZN crystal powders were mixed as described above, and the resultant mixture was then calcined. Calcination was performed at 700° C. for 5 hours (samples 1 to 13) and at 950° C. for 5 hours (samples 14 to 16) to prepare two types.

The PZT-PMN compound perovskite oxide used in the sample 20 was prepared by mixing the PZT and PMN crystal powders as described above, and then calcining the resultant mixture at 950° C. for 5 hours.

The PZT-PNN compound perovskite oxide used in the sample 21 was prepared by mixing the PZT and PNN crystal powders as described above, and then calcining the resultant mixture at 950° C. for 5 hours.

As the crystallized glass powder contained in the piezoelectric paste, glass powder having the composition b-1 shown in Table 1 was used.

As the organic vehicle contained in the piezoelectric paste, an ethyl cellulose-based vehicle was used.

The piezoelectric crystal powder, the crystallized glass powder and the organic vehicle were used so that 76% by weight of piezoelectric crystal powder, 4% by weight of crystallized glass powder and 20% by weight of organic vehicle were combined. An organic solvent was added to the resultant mixture, and then dispersed by using a roll mill to prepare piezoelectric paste of each of the samples 11 to 21.
Preparation of Piezoelectric Part Next, in order to obtain the piezoelectric part 1 shown in FIG. 2, the insulating substrate 2 having the lower layer electrode 3 and the back surface electrode 6 was prepared in the same manner as the above-described experiment. In order to form the piezoelectric film 4 on the lower layer electrode 3, a coating of the piezoelectric paste of each of the above samples was formed by screen printing, sufficiently dried, and then heat-treated for burning in air.

In this heat treatment, a temperature profile was used for the samples 11 to 19 in which the coating was heated at a heating rate of 1° C./min in the glass crystallization temperature region of 500 to 700° C., and then completely sintered by maintaining at each of temperatures 800° C., 900° C. and 950° C. for 3 hours, as shown in the "burning condition" column in Table 3. For the samples 20 and 21, a temperature profile was used in which after heating, the coating was completely sintered by maintaining at 800 ° C. for 3 hours. The thickness of the piezoelectric film 4 after burning was adjusted to about 50 μm.

Then, the upper layer electrode 5 and the end surface electrode 7 were formed by the same method as the above experiment to prepare the piezoelectric part 1 of each of the samples. The thus-obtained piezoelectric parts 1 were polarized under the same conditions as the above experiment.

As a result of measurement of dielectric properties of the piezoelectric part 1 of each sample, as shown in Table 3, samples 11 to 16 exhibit excessively high dielectric constants $\in_r$, high remanent polarization $P_r$ obtained by dielectric hysteresis analysis, and a low coercive electric field $E_c$, as compared with the samples 17 to 19.

As shown in Table 3, the samples 20 and 21 exhibit high dielectric constants $\in_r$, as compared with the samples 17 to 19, particularly sample 17 obtained under the same burning conditions.

Figure 4:
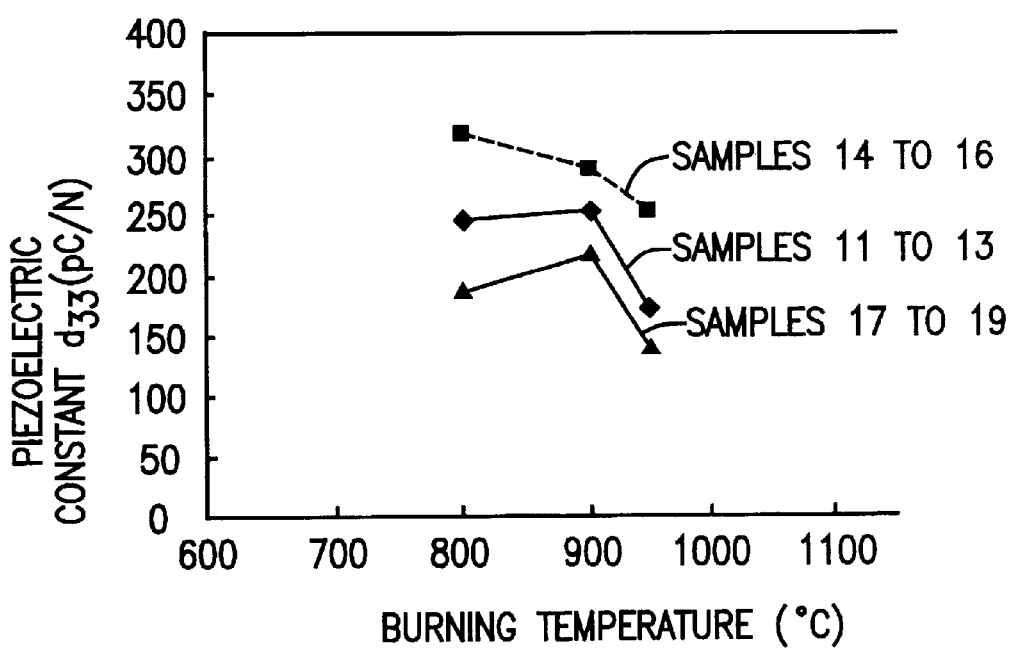
FIG. 4 is a graph showing the relation between the piezoelectric constant $d_{33}$ of a piezoelectric film formed by burning a piezoelectric paste and the burning temperature in accordance with a specified embodiment of the present invention with respect to Samples 11 to 19 shown in Table 3.

FIG. 4 shows the relation between the burning temperature for forming the piezoelectric film 4 and the piezoelectric constant $d_{33}$ in the direction parallel to the polarization axis with respect to the samples 11 to 19. FIG. 4 indicates that the samples 11 to 13 and 14 to 16 exhibit higher polarizability and piezoelectricity than the samples 17 to 19.

As described above, a piezoelectric film can be formed by burning a piezoelectric paste of the present invention in air at a relatively low temperature of 1000° C. or less while using a conventional technique of forming thick films. Since the piezoelectric paste contains a crystallized glass powder which precipitates a solid solution phase by heat treatment, it is possible to obtain a piezoelectric film which can easily be polarized while maintaining the ferroelectricity possessed by a piezoelectric crystal powder.

Particularly, in a preferred embodiment, the piezoelectric paste contains a piezoelectric crystal powder containing Pb(Zr, Ti)$O_3$ system ceramic and a crystallized glass powder which precipitates a Pb(Zr, Ti)$O_3$ system solid solution phase by heat treatment. It is thus possible to obtain a piezoelectric film which can easily be polarized while maintaining the ferroelectricity possessed by the piezoelectric crystal powder.

Furthermore, the temperature of burning for forming the piezoelectric film is selected in the range of about 800 to 950° C. to obtain higher piezoelectricity.

A piezoelectric paste of the present invention can use the piezoelectric crystal powder comprising a compound perovskite oxide containing a first component having a composition represented by the formula Pb(Zr$_x$Ti$_{1-x}$)O$_3$ wherein x is in the range of about 0.49 to 0.56, and a second component having a composition represented by the formula Pb(Zn$_{1/3}$Nb$_{2/3}$)O$_3$, Pb(Mg$_{1/3}$Nb$_{2/3}$)O$_3$ or Pb(Ni$_{1/3}$Nb$_{2/3}$)O$_3$, wherein the content of the second component is in the range of about 10% to 40% by weight based on the total of the first and second components. This permits burning at a lower temperature than the use of Pb(Zr, Ti)O$_3$ system ceramic only, and facilitates polarization, thereby obtaining a piezoelectric film having high piezoelectricity.

The second component preferably further contains BaTiO$_3$ to prevent a pyrochlore phase as a paraelectric phase from remaining due to a shortage of seed crystals, thereby forming a perovskite single phase.

Furthermore, the crystallized glass powder contained in the piezoelectric paste of the present invention contains a main component represented by the formula iPbO—jTiO$_2$—kZrO$_2$—mSiO$_2$ wherein i is in the range of about 62 to 70 mol %, j is in the range of about 7 to 19 mol %, k is in the range of about 7 to 19 mol % and m is in the range of about 8 to 9 mol %, and an additive component composed of Bi$_2$O$_3$ or MnO$_2$ and having a content of about 3 parts by weight based on 100 parts by weight of main component. In this case, the growth of the crystal grains in the crystallized glass powder can be further promoted.

Besides the Pb(Zr, Ti)O$_3$ system, examples of the piezoelectric crystal powder or the solid solution phase precipitated by heat treatment include the Pb(Zn, Nb)O$_3$ system, Pb(Mg, Nb)O$_3$ system, Pb(Ni, Nb)O$_3$ system, Pb(Mn, Nb)O$_3$ system, Pb(Sn, Nb)O$_3$ system, Pb(Co, Nb)O$_3$ system, Pb(Fe, Nb)O$_3$ system, and the like.

Besides Pb(Zn$_{1/3}$Nb$_{2/3}$)O$_3$, Pb(Mg$_{1/3}$Nb$_{2/3}$)O$_3$ and Pb(Ni$_{1/3}$Nb$_{2/3}$)O$_3$, the second component of the piezoelectric crystal powder can appropriately be selected from Pb(Mn$_{1/3}$Nb$_{2/3}$)O$_3$, Pb(Sn$_{1/2}$Nb$_{1/2}$)O$_3$, Pb(Co$_{1/3}$Nb$_{2/3}$)O$_3$ and Pb(Fe$_{1/2}$Nb$_{1/2}$)O$_3$ to obtain a piezoelectric film having excellent piezoelectricity.

What is claimed is:

1. Piezoelectric paste comprising:
   a piezoelectric crystal powder;
   a crystallized glass powder which precipitates a solid solution phase having ferroelectricity upon heat treatment; and
   an organic vehicle.

2. The piezoelectric paste according to claim 1 wherein the piezoelectric crystal powder comprises a Pb(Zr, Ti)O$_3$ ceramic; and wherein the crystallized glass powder precipitates a Pb(Zr, Ti)O$_3$ solid solution phase.

3. Piezoelectric paste according to claim 2, wherein the piezoelectric crystal powder comprises a composition represented by the formula Pb(Zr$_x$Ti$_{1-x}$)O$_3$ in which x in the range of about 0.49 to 0.56.

4. Piezoelectric paste according to claim 2, wherein the piezoelectric crystal powder comprises a compound perovskite oxide comprising a first component having a composition represented by the formula Pb(Zr$_x$Ti$_{1-x}$)O$_3$ in which x is in the range of about 0.49 to 0.56, and a second component having a composition represented by the formula Pb(Zn$_{1/3}$Nb$_{2/3}$)O$_3$, Pb(Mg$_{1/3}$Nb$_{2/3}$)O$_3$ or Pb(Ni$_{1/3}$Nb$_{2/3}$)O$_3$, wherein the content of the second component is in the range of about 10% to 40% by weight based on the total of the first and second components.

5. Piezoelectric paste according to claim 4, wherein the compound perovskite oxide is a heat treated, calcined mixture of the first component and the second component.

6. Piezoelectric paste according to claim 5, wherein the second component further comprises BaTiO$_3$.

7. Piezoelectric paste according to claim 6, wherein the $BaTiO_3$ is a crystal powder having an average particle diameter of about 0.5 μm or less.

8. Piezoelectric paste according to claim 7, wherein the crystallized glass powder comprises a main component represented by the formula $iPbO$—$jTiO_2$—$kZrO_2$—$mSiO_2$ wherein i is in the range of about 62 to 70 mol %, j is in the range of 7 to 19 mol %, k is in the range of about 7 to 19 mol %, and m is in the range of about 8 to 9 mol %, and an additive component which is $Bi_2O_3$ or $MnO_2$ at a content of about 3 parts by weight based on 100 parts by weight of main component.

9. Piezoelectric paste according to claim 2, wherein the crystallized glass powder comprises a main component represented by the formula $iPbO$—$jTiO_2$—$kZrO_2$—$mSiO_2$ wherein i is in the range of about 62 to 70 mol %, j is in the range of 7 to 19 mol %, k is in the range of about 7 to 19 mol %, and m is in the range of about 8 to 9 mol %, and an additive component which is $Bi_2O_3$ or $MnO_2$ at a content of about 3 parts by weight based on 100 parts by weight of main component.

10. Piezoelectric paste according to claim 3, wherein the crystallized glass powder comprises a main component represented by the formula $iPbO$—$jTiO_2$—$kZrO_2$—$mSiO_2$ wherein i is in the range of about 62 to 70 mol %, j is in the range of 7 to 19 mol %, k is in the range of about 7 to 19 mol %, and m is in the range of about 8 to 9 mol %, and an additive component which is $Bi_2O_3$ or $MnO_2$ at a content of about 3 parts by weight based on 100 parts by weight of main component.

11. Piezoelectric paste according to claim 4, wherein the crystallized glass powder comprises a main component represented by the formula $iPbO$—$jTiO_2$—$kZrO_2$—$mSiO_2$ wherein i is in the range of about 62 to 70 mol %, j is in the range of 7 to 19 mol %, k is in the range of about 7 to 19 mol %, and m is in the range of about 8 to 9 mol %, and an additive component which is $Bi_2O_3$ or $MnO_2$ at a content of about 3 parts by weight based on 100 parts by weight of main component.

12. A piezoelectric film element comprising a substrate having a film of burned piezoelectric paste according to claim 8 thereon.

13. A piezoelectric film element according to claim 12, wherein the burning temperature was in the range of 800 to 950° C.

14. A piezoelectric part comprising an insulating substrate, a first electrode on the insulating substrate, a piezoelectric film on the first electrode and a second electrode on the piezoelectric film, wherein the piezoelectric film comprises a burned piezoelectric paste according to claim 8.

15. A piezoelectric film element comprising a substrate having a film of burned piezoelectric paste according to claim 2 thereon.

16. A piezoelectric film element according to claim 15, wherein the burning temperature was in the range of 800 to 950° C.

17. A piezoelectric part comprising an insulating substrata, a first electrode on the insulating substrate, a piezoelectric film on the first electrode and a second electrode on the piezoelectric film, wherein the piezoelectric film comprises a burned piezoelectric paste according to claim 2.

18. A piezoelectric film element comprising a substrate having a film of burned piezoelectric paste according to claim 1 thereon.

19. A piezoelectric film element according to claim 17, wherein the burning temperature was in the range of 800 to 950° C.

20. A piezoelectric part comprising an insulating substrate, a first electrode on the insulating substrate, a piezoelectric film on the first electrode and a second electrode on the piezoelectric film, wherein the piezoelectric film comprises a burned piezoelectric paste according to claim 1.

* * * * *